United States Patent
Tsao et al.

(10) Patent No.: US 7,408,190 B2
(45) Date of Patent: Aug. 5, 2008

(54) THIN FILM TRANSISTOR AND METHOD OF FORMING THE SAME

(75) Inventors: Wen-Kuang Tsao, Taoyuan County (TW); Hung-I Hsu, Miaoli County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 188 days.

(21) Appl. No.: 11/160,660

(22) Filed: Jul. 5, 2005

(65) Prior Publication Data

US 2007/0007522 A1    Jan. 11, 2007

(51) Int. Cl.
- H01L 29/04 (2006.01)
- H01L 29/10 (2006.01)
- H01L 31/20 (2006.01)
- H01L 31/036 (2006.01)
- H01L 31/0376 (2006.01)

(52) U.S. Cl. .............. 257/57; 257/59; 257/66; 257/72; 257/347; 257/291; 257/292; 257/439; 257/443; 257/213; 257/413; 438/149; 438/135; 438/142

(58) Field of Classification Search .......... 257/E29.151, 257/E27.1, E29.117, E29.137, E51.005, 57, 257/59, 66, 72, 347, 213–413, 900, 902–903, 257/291, 292, 439, 443, 665, 27.125, E27.112, 257/E29.145, E29.147, E29.182, E29.202, 257/E29.273–E29.299, E29.314, E29.32, 257/23.016, E21.431–E21.435, E21.619–E21.62, 257/E29.325–E21.346, E21.19–E21.21, E21.394–E24.458; 438/135, 142, 149; 257/E21.615–E21.694

See application file for complete search history.

(56) References Cited

U.S. PATENT DOCUMENTS

| | | | |
|---|---|---|---|
| 2002/0047947 A1* | 4/2002 | Hur et al. ....................... | 349/42 |
| 2002/0119586 A1* | 8/2002 | Kido ............................ | 438/30 |
| 2003/0036221 A1 | 2/2003 | Song et al. ................... | 438/141 |
| 2005/0024519 A1* | 2/2005 | Nishida et al. .............. | 348/340 |
| 2005/0024549 A1* | 2/2005 | Gotoh et al. ................. | 349/43 |

FOREIGN PATENT DOCUMENTS

JP    2000-284326    * 3/1999

* cited by examiner

Primary Examiner—Dao H Nguyen
Assistant Examiner—Tram H Nguyen
(74) Attorney, Agent, or Firm—Jianq Chyun IP Office

(57) ABSTRACT

A thin film transistor including a gate, a gate insulating layer, a semiconductor layer and a source/drain is provided. The gate is disposed over a substrate, wherein the gate comprises at least one molybdenum-niobium alloy nitride layer. The gate insulating layer is formed over the substrate to cover the gate. The semiconductor layer is disposed over the gate insulating layer above the gate. The source/drain is disposed over the semiconductor layer.

2 Claims, 2 Drawing Sheets

THIN FILM TRANSISTOR AND METHOD OF FORMING THE SAME

BACKGROUND OF THE INVENTION

1. Field of the Invention

The present invention generally relates to a semiconductor device and a method of forming the same. More particularly, the present invention relates to a thin film transistor and a method of forming the same.

2. Description of Related Art

A thin film transistor (TFT) typically includes a gate, a gate insulating layer, a channel layer, a source/drain, and is usually used as a switching device in displays such as liquid crystal displays (LCDs). Usually, the TFT is formed by sequentially forming a gate, a gate insulating layer, an α-Si channel layer and a source/drain on a substrate. The gate is made of a single metal layer of aluminium (Al), chromium (Cr), tungsten (W), tantalum (Ta) or titanium (Ti), or made of multiple metal layers.

However, when a single-layer of the above-mentioned metal is used to form the gate, the surface of the layer can be easily eroded and reacts with oxygen in the atmosphere to form metal oxide, such that the subsequent etch process cannot be performed effectively. On the other hand, when the gate is made of multiple metal layers, such as molybdenum (Mo)/Al/Mo, oxidation and erosion can be prevented, but the process for forming multiple metal layers is surely more complex because more than one sputtering targets or deposition chambers are required. Moreover, the above problems also arise in the process for forming the source/drain.

SUMMARY OF THE INVENTION

Accordingly, the present invention is directed to a thin film transistor having a gate and a source/drain with a lower contact resistance or wire resistance.

The present invention is also directed to a method of forming a thin film transistor that uses an oxidation-resistant and erosion-resistant material to form a gate and/or a source/drain.

According to an embodiment of the present invention, a thin film transistor is provided. The thin film transistor includes a gate, a gate insulating layer, a semiconductor layer and a source/drain. The gate is disposed over a substrate, wherein the gate comprises at least one molybdenum-niobium alloy nitride layer. The gate insulating layer is formed over the substrate to cover the gate. The semiconductor layer is disposed over the gate insulating layer above the gate. The source/drain is disposed over the semiconductor layer.

According to another embodiment of the present invention, a thin film transistor is provided. The thin film transistor includes a gate, a gate insulating layer, a semiconductor layer and a source/drain. The gate is disposed over a substrate. The gate insulating layer is formed over the substrate to cover the gate. The semiconductor layer is disposed over the gate insulating layer above the gate. The source/drain is disposed over the semiconductor layer, wherein the source/drain comprises at least one molybdenum-niobium alloy nitride layer.

According to an embodiment of the present invention, the gate is made of a molybdenum-niobium alloy layer and a molybdenum-niobium alloy nitride layer.

According to an embodiment of the present invention, the gate is made of a first molybdenum-niobium alloy nitride layer, a molybdenum-niobium alloy layer and a second molybdenum-niobium alloy nitride layer.

According to an embodiment of the present invention, the source/drain is made of a molybdenum-niobium alloy layer and a molybdenum-niobium alloy nitride layer.

According to an embodiment of the present invention, the source/drain is made of a first molybdenum-niobium alloy nitride layer, a molybdenum-niobium alloy layer and a second molybdenum-niobium alloy nitride layer.

The present invention provides another method of forming a thin film transistor. A gate is formed over a substrate, wherein the gate comprises at least one molybdenum-niobium alloy nitride layer. A gate insulating layer is formed over the substrate to cover the gate. A semiconductor layer is formed over the gate insulating layer above the gate. A source/drain is formed over the semiconductor layer.

The present invention provides still another method of forming a thin film transistor. A gate is formed over a substrate. A gate insulating layer is formed over the substrate to cover the gate. A semiconductor layer is formed over the gate insulating layer above the gate. A source/drain is formed over the semiconductor layer, wherein the source/drain comprises at least one molybdenum-niobium alloy nitride layer.

According to an embodiment of the present invention, the gate and/or the source/drain can be formed by the steps of forming a molybdenum-niobium alloy layer over the substrate; performing a nitridation step for the molybdenum-niobium alloy layer to form a molybdenum-niobium alloy nitride layer; and patterning the molybdenum-niobium alloy nitride layer to form the gate and/or the source/drain.

According to an embodiment of the present invention, the gate and/or the source/drain can be formed by the steps of forming a first molybdenum-niobium alloy layer over the substrate; forming a second molybdenum-niobium alloy layer over the first molybdenum-niobium alloy layer; performing a nitridation step for the second molybdenum-niobium alloy layer to form a molybdenum-niobium alloy nitride layer on the first molybdenum-niobium alloy layer; and patterning the molybdenum-niobium alloy nitride layer and the first molybdenum-niobium alloy layer to form the gate and/or the source/drain.

According to an embodiment of the present invention, the gate and/or the source/drain can be formed by the steps of forming a first molybdenum-niobium alloy layer over the substrate; performing a first nitridation step for the first molybdenum-niobium alloy layer to form a first molybdenum-niobium alloy nitride layer; forming a second molybdenum-niobium alloy layer over the first molybdenum-niobium alloy nitride layer; forming a third molybdenum-niobium alloy layer over the second molybdenum-niobium alloy layer; and performing a second nitridation step for the third molybdenum-niobium alloy layer to form a second molybdenum-niobium alloy nitride layer on the second molybdenum-niobium alloy layer; and patterning the second molybdenum-niobium alloy nitride layer, the second molybdenum-niobium alloy layer and the first molybdenum-niobium alloy nitride layer to form the gate and/or the source/drain.

The electrodes (gate and/or source/drain) of the thin film transistor comprise at least one molybdenum-niobium alloy nitride layer which is more stable than metal alloy used in the prior art because a nitride protective thin film is formed on the surface of the molybdenum-niobium alloy so that the electrodes using the same are more resistant to oxidation and erosion.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
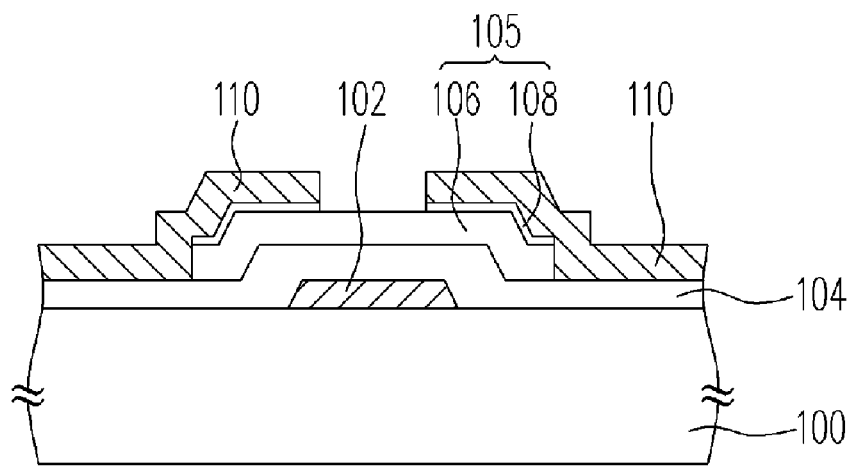
FIG. 1 is a cross-sectional view of a thin film transistor according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a thin film transistor according to an embodiment of the present invention. As shown in FIG. 1, the thin film transistor comprises a gate 102, a gate insulating layer 104, a semiconductor layer 105 and a source/drain 110. The gate 102 is disposed over a substrate 100. The gate insulating layer 104 is disposed over the substrate 100 to cover the gate 102. The gate insulating layer 104 is made of a silicon oxide layer, a silicon nitride layer or a combination thereof, for example. The semiconductor layer 105 is disposed over the gate insulating layer 104 above the gate 102. The source/drain 110 is disposed over the semiconductor layer 105. In an embodiment, the semiconductor layer 105 comprises a channel layer 106 formed on the gate insulating layer 104 and an ohmic contact layer 108 formed between the channel layer 106 and the source/drain 110.

In particular, the gate 102 comprises at least one molybdenum-niobium (Mo—Nb) alloy nitride layer according to an embodiment of the present invention. In other words, the gate 102 may be a single layer of molybdenum-niobium alloy nitride or a multiple layer comprising at least one molybdenum-niobium alloy nitride layer. If the gate 102 is a single layer, the gate 102 is composed of a molybdenum-niobium alloy nitride layer. In the present embodiment, the method of forming the single-layered gate 102 is as follows. Firstly, a molybdenum-niobium alloy layer is formed over the substrate 100 in a sputtering process chamber, an evaporation process chamber or other conventional deposition chamber. A nitridation step is performed for the molybdenum-niobium alloy layer so as to form a molybdenum-niobium alloy nitride layer. The nitridation step can be carried out with flowing nitrogen gas into the above deposition chamber, after forming the molybdenum-niobium alloy layer, for example, or flowing nitrogen gas into the above deposition chamber when depositing the molybdenum-niobium alloy layer, for example. Thereafter, the molybdenum-niobium alloy nitride layer is patterned by a photolithography process and etching process to form the gate 102.

Figure 2A:
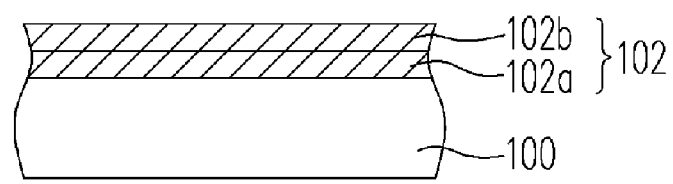
FIG. 2A is a cross-sectional view showing a two-layered gate of a thin film transistor according to another embodiment of the present invention.

If the gate 102 is a two-layered structure, the gate 102 is made of a molybdenum-niobium alloy layer 102a and a molybdenum-niobium alloy nitride layer 102b (as shown in FIG. 2A). In the present embodiment, the method of forming the two-layered gate 102 is as follows. Firstly, a first molybdenum-niobium alloy layer 102a is formed over the substrate 100. A second molybdenum-niobium alloy layer (not shown) is formed over the first molybdenum-niobium alloy layer 102a. A nitridation step is performed for the second molybdenum-niobium alloy layer so as to form a molybdenum-niobium alloy nitride layer 102b. Thereafter, the molybdenum-niobium alloy nitride layer 102b and the first molybdenum-niobium alloy layer 102a are patterned to form the gate 102. The first molybdenum-niobium alloy layer 102a and the second molybdenum-niobium alloy layer are formed by the above method, and the nitridation step is also performed by the above method.

Figure 3A:
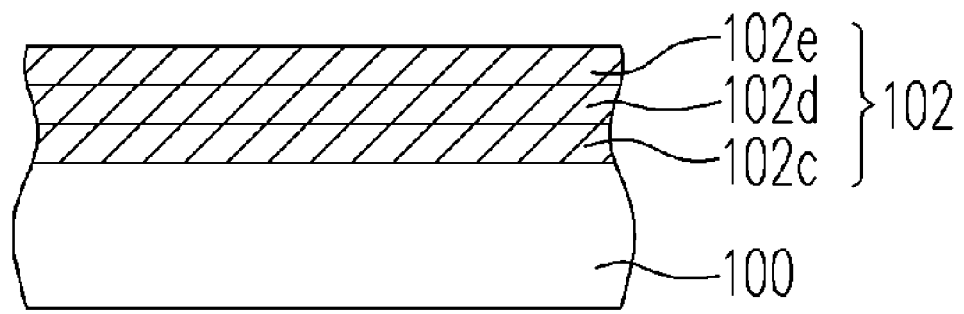
FIG. 3A is a cross-sectional view showing a three-layered gate of a thin film transistor according to yet another embodiment of this invention.

When the gate 102 is a three-layered structure, the gate 102 is made of a first molybdenum-niobium alloy nitride layer 102c, a molybdenum-niobium alloy layer 102d and a second molybdenum-niobium alloy nitride layer 102e (as shown in FIG. 3A). In the present embodiment, the method of forming the three-layered gate 102 is as follows. Firstly, a first molybdenum-niobium alloy layer (not shown) is formed over the substrate 100. A first nitridation step as above mentioned is performed for the first molybdenum-niobium alloy layer so as to form a first molybdenum-niobium alloy nitride layer 102c. Then, a second molybdenum-niobium alloy layer 102d is formed over the first molybdenum-niobium alloy nitride layer 102c, and a third molybdenum-niobium alloy layer (not shown) is formed over the second molybdenum-niobium alloy layer 102d. Thereafter, a nitridation step as above mentioned is performed for the third molybdenum-niobium alloy layer so as to form a second molybdenum-niobium alloy nitride layer 102e. Thereafter, the second molybdenum-niobium alloy nitride layer 102e, the second molybdenum-niobium alloy layer 102d and the first molybdenum-niobium alloy nitride layer 102c are patterned to form the gate 102.

In another embodiment, the source/drain 110 comprises at least one molybdenum-niobium (Mo—Nb) alloy nitride layer, as shown in FIG. 1. In other words, the source/drain 110 may be a single layer of molybdenum-niobium alloy nitride or a multiple layer comprising at least one molybdenum-niobium alloy nitride layer. If the source/drain 110 is a single layer, the source/drain 110 is composed of a molybdenum-niobium alloy nitride layer. Similarly, the method of forming the single-layered source/drain 110 is as follows. Firstly, a molybdenum-niobium alloy layer is formed over the gate insulating layer 104 to cover the semiconductor layer 105 in a sputtering process chamber, an evaporation process chamber or other conventional deposition chamber. A nitridation step is performed for the molybdenum-niobium alloy layer so as to form a molybdenum-niobium alloy nitride layer. The nitridation step can be carried out with flowing nitrogen gas into the above deposition chamber after forming the molybdenum-niobium alloy layer, for example, or flowing nitrogen gas into the above deposition chamber when depositing the molybdenum-niobium alloy layer, for example. Thereafter, the molybdenum-niobium alloy nitride layer is patterned to form the source/drain 110.

Figure 2B:
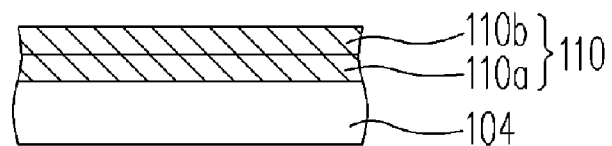
FIG. 2B is a cross-sectional view showing a two-layered source/drain of a thin film transistor according to still another embodiment of this invention.

If the source/drain 110 is a two-layered structure, the source/drain 110 is made of a molybdenum-niobium alloy layer 110a and a molybdenum-niobium alloy nitride layer 110b (as shown in FIG. 2B). Similarly, the method of forming the two-layered source/drain 110 is as follows. Firstly, a first molybdenum-niobium alloy layer 110a is formed over the gate insulating layer 104 to cover the semiconductor layer 105. A second molybdenum-niobium alloy layer (not shown) is formed over the first molybdenum-niobium alloy layer 110a. A nitridation step is performed for the second molybdenum-niobium alloy layer so as to form a molybdenum-niobium alloy nitride layer 110b. Thereafter, the molybdenum-niobium alloy nitride layer 110b and the first molybdenum-niobium alloy layer 110a are patterned to form the source/drain 110. The first molybdenum-niobium alloy layer 110a and the second molybdenum-niobium alloy layer 110b are formed by the method as mentioned above, and the nitridation step is also performed by the method as mentioned above.

Figure 3B:
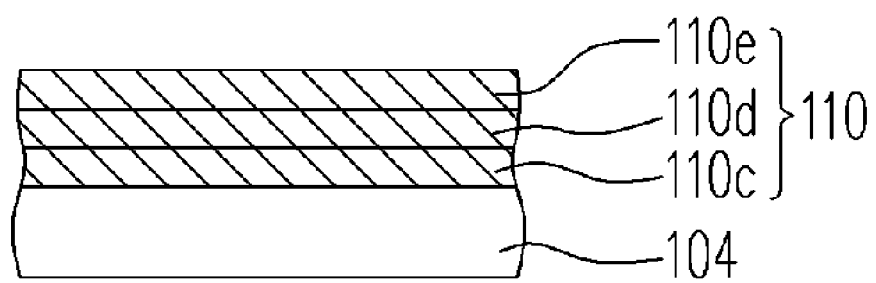
FIG. 3B is a cross-sectional view showing a three-layered source/drain of a thin film transistor according to yet another embodiment of this invention.

When the source/drain 110 is a three-layered structure, the source/drain 110 is made of a first molybdenum-niobium alloy nitride layer 110c, a molybdenum-niobium alloy layer 110d and a second molybdenum-niobium alloy nitride layer 110e (as shown in FIG. 3B). Similarly, the method of forming the three-layered source/drain 110 is as follows. Firstly, a first molybdenum-niobium alloy layer (not shown) is formed over the gate insulating layer 104 to cover the semiconductor layer 105. A nitridation step as above mentioned is performed for the first molybdenum-niobium alloy layer so as to form a first molybdenum-niobium alloy nitride layer 110c. Then, a second molybdenum-niobium alloy layer 110d is formed over the first molybdenum-niobium alloy nitride layer 110c, and a third molybdenum-niobium alloy layer (not shown) is formed over the second molybdenum-niobium alloy layer 110d. A nitridation step as above mentioned is performed for the third molybdenum-niobium alloy layer so as to form a second molybdenum-niobium alloy nitride layer 110e. Thereafter, the second molybdenum-niobium alloy nitride layer 110e, the second molybdenum-niobium alloy layer 110d and the first molybdenum-niobium alloy nitride layer 11c are patterned to form the source/drain 110.

In another embodiment, both the gate 102 and the source/drain 110 comprise at least one molybdenum-niobium alloy nitride layer, respectively. In other words, both the gate 102 and the source/drain 110 can be a single layer of molybdenum-niobium alloy nitride or a multiple layer comprising at least one molybdenum-niobium alloy nitride layer, respectively. The multiple layer comprising at least one molybdenum-niobium alloy nitride layer can be a two-layered structure or a three-layered structure, as shown in FIGS. 2A, 2B, 3A and 3B.

It is noted that the molybdenum-niobium alloy nitride layer is more stable than metal alloy used in the prior art because a nitride protective thin film is formed on the surface of the molybdenum-niobium alloy so that the molybdenum-niobium alloy nitride layer is more resistant to oxidation and erosion. In other words, the electrodes of the thin film transistor comprising at least one layer of molybdenum-niobium alloy nitride layer are more resistant to oxidation and erosion. In particular, if a three-layered gate or source/drain is formed, the molybdenum-niobium alloy layer is sandwiched between the two molybdenum-niobium alloy nitride layers so as to protect the molybdenum-niobium alloy layer from oxidizing and being eroded.

In addition, the deposition process of the molybdenum-niobium alloy layer and the nitridation step can be performed in the same chamber (in-situ). If the two-layered or three-layered structure is formed, these layers can also be formed in the same chamber (in-situ). Therefore, the gate and/or source/drain manufacturing process of the present invention is not complex and the yield can be improved.

Moreover, the resistance to oxidation and erosion of a molybdenum-niobium alloy may also be enhanced by increasing the amount of niobium, but the molybdenum-niobium alloy target having more niobium is more expensive. In the present invention, the nitridation step is performed for the molybdenum-niobium alloy instead of increasing the amount of niobium of the molybdenum-niobium alloy, such that the manufacturing cost can be reduced.

It should be noted that if the thin film transistor of the present invention serves as a switching device of a LCD and if a two-layered or three-layered source/drain is used, the upper molybdenum-niobium alloy nitride layer can also act as an etching stop layer when a contact hole etching process for each pixel structure is performed subsequently.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor, comprising:
    a gate disposed over a substrate, wherein the gate is a single-layered molybdenum-niobium (Mo-Nb) alloy nitride layer;
    a gate insulating layer formed over the substrate to cover the gate;
    a semiconductor layer disposed over the gate insulating layer above the gate; and
    a source/drain disposed over the semiconductor layer, wherein the source/drain comprises:
        a molybdenum-niobium alloy layer; and
        a molybdenum-niobium alloy nitride layer disposed over the molybdenum-niobium alloy layer.

2. A thin film transistor, comprising:
    a gate disposed over a substrate, wherein the gate is a single-layered molybdenum-niobium (Mo-Nb) alloy nitride layer;
    a gate insulating layer formed over the substrate to cover the gate;
    a semiconductor layer disposed over the gate insulating layer above the gate; and
    a source/drain disposed over the semiconductor layer, wherein the source/drain comprises:
        a first molybdenum-niobium alloy nitride layer;
        a molybdenum-niobium alloy layer disposed over the first molybdenum-niobium alloy nitride layer; and
        a second molybdenum-niobium alloy nitride layer disposed over the molybdenum-niobium alloy layer.

* * * * *